US011490492B1

(12) United States Patent
Kuo et al.

(10) Patent No.: US 11,490,492 B1
(45) Date of Patent: Nov. 1, 2022

(54) SENSING MODULE AND ELECTRONIC DEVICE

(71) Applicant: WISTRON NEWEB CORPORATION, Hsinchu (TW)

(72) Inventors: Yu-Fu Kuo, Hsinchu (TW); Wen-Pin Ho, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 0 days.

(21) Appl. No.: 17/582,029

(22) Filed: Jan. 24, 2022

(30) Foreign Application Priority Data

Aug. 11, 2021 (TW) .................................. 110129550

(51) Int. Cl.
*H05B 45/20* (2020.01)
*G06F 3/0354* (2013.01)
*H05B 47/115* (2020.01)
*G01R 27/26* (2006.01)
*F21V 11/00* (2015.01)
*F21Y 115/10* (2016.01)

(52) U.S. Cl.
CPC ............ *H05B 47/115* (2020.01); *F21V 11/00* (2013.01); *G01R 27/2605* (2013.01); *H05B 45/20* (2020.01); *F21Y 2115/10* (2016.08)

(58) Field of Classification Search
CPC ........ H05B 45/10; H05B 45/20; H05B 47/10; H05B 47/115; G06F 3/016; G06F 3/017; G06F 3/04886; G06F 3/03547; G06F 3/042; G06F 3/044; G01R 27/2605; F21V 11/00; F21Y 2115/10
See application file for complete search history.

(56) References Cited

U.S. PATENT DOCUMENTS

| 7,817,217 | B2 | 10/2010 | Lee et al. |
| 2014/0071050 | A1* | 3/2014 | Armstrong-Muntner .................... G06F 3/03547 345/158 |
| 2016/0084486 | A1 | 3/2016 | Chen et al. |
| 2018/0218859 | A1* | 8/2018 | Ligtenberg .............. H01L 41/09 |
| 2019/0191533 | A1* | 6/2019 | Cheng ..................... G06F 3/044 |
| 2021/0191552 | A1* | 6/2021 | Bok ....................... G06F 1/1658 |

FOREIGN PATENT DOCUMENTS

| TW | 200944879 A | 11/2009 |
| TW | 201613420 A | 4/2016 |
| TW | 202040331 A | 11/2020 |

* cited by examiner

*Primary Examiner* — Haissa Philogene
(74) *Attorney, Agent, or Firm* — McClure, Qualey & Rodack, LLP

(57) ABSTRACT

A sensing module and an electronic device are provided. The sensing module includes a substrate, at least one light-emitting unit, a light-guiding assembly, at least one sensing circuit structure, and a sensing processor. The light-guiding assembly is connected to the substrate and includes at least one light-guiding structure. The at least one light-emitting unit is configured to emit a light beam outwardly through the at least one light-guiding structure. One end of the at least one sensing circuit structure is disposed on the substrate. The sensing processor is disposed on the substrate, and is configured to sense a capacitance change in a peripheral area of the at least one sensing circuit structure by the at least one sensing circuit structure and to generate a sensing signal. The sensing processor or an external controller is configured to control the at least one light-emitting unit according to the sensing signal.

11 Claims, 16 Drawing Sheets

US 11,490,492 B1

SENSING MODULE AND ELECTRONIC DEVICE

CROSS-REFERENCE TO RELATED PATENT APPLICATION

This application claims the benefit of priority to Taiwan Patent Application No. 110129550, filed on Aug. 11, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a sensing module and an electronic device, and more particularly to a sensing module that includes a light-emitting unit and an electronic device that includes the sensing module.

BACKGROUND OF THE DISCLOSURE

A conventional capacitive sensing module is configured in a laptop to sense changes in capacitance around a housing of the laptop, so that relevant components can be controlled to actuate accordingly. Since a metal sensing structure of such a capacitive sensing module is disposed away from the housing, a sensing effect of the sensing module is poor. Further, there are numerous electronic components disposed between the metal sensing structure and the housing. In light of the foregoing, it is not uncommon for the conventional capacitive sensing module to result in wrong actions.

SUMMARY OF THE DISCLOSURE

In response to the above-referenced technical inadequacy, the present disclosure provides a sensing module and an electronic device, so as to address an issue associated with wrong actions resulting from a conventional capacitive sensing module.

In one aspect, the present disclosure provides a sensing module that includes a substrate, at least one light-emitting unit, a light-guiding assembly, at least one sensing circuit structure, and a sensing processor. The light-guiding assembly is connected to the substrate and includes at least one light-guiding structure. The at least one light-emitting unit is configured to emit a light beam outwardly through the at least one light-guiding structure. One end of the at least one sensing circuit structure is disposed on the substrate, and one portion of the at least one sensing circuit structure is disposed on one side surface of the light-guiding assembly. The sensing processor is disposed on the substrate. The sensing processor is configured to sense a capacitance change in a peripheral area of the at least one sensing circuit structure by the at least one sensing circuit structure and is configured to generate a sensing signal. The sensing processor or an external controller is configured to control the at least one light-emitting unit according to the sensing signal.

In another aspect, the present disclosure provides an electronic device that includes a housing and the sensing module. A portion of the light-guiding assembly is exposed from the housing, and the light beam emitted from the at least one light-emitting unit is configured to pass through the light-guiding assembly and be emitted outwardly from the portion of the light-guiding assembly that is exposed from the housing.

Therefore, in the sensing module and the electronic device provided by the present disclosure, the at least one sensing circuit structure is disposed on a side surface of the light-guiding structure, so as to significantly reduce occurrences of malfunctioning or wrong actions.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
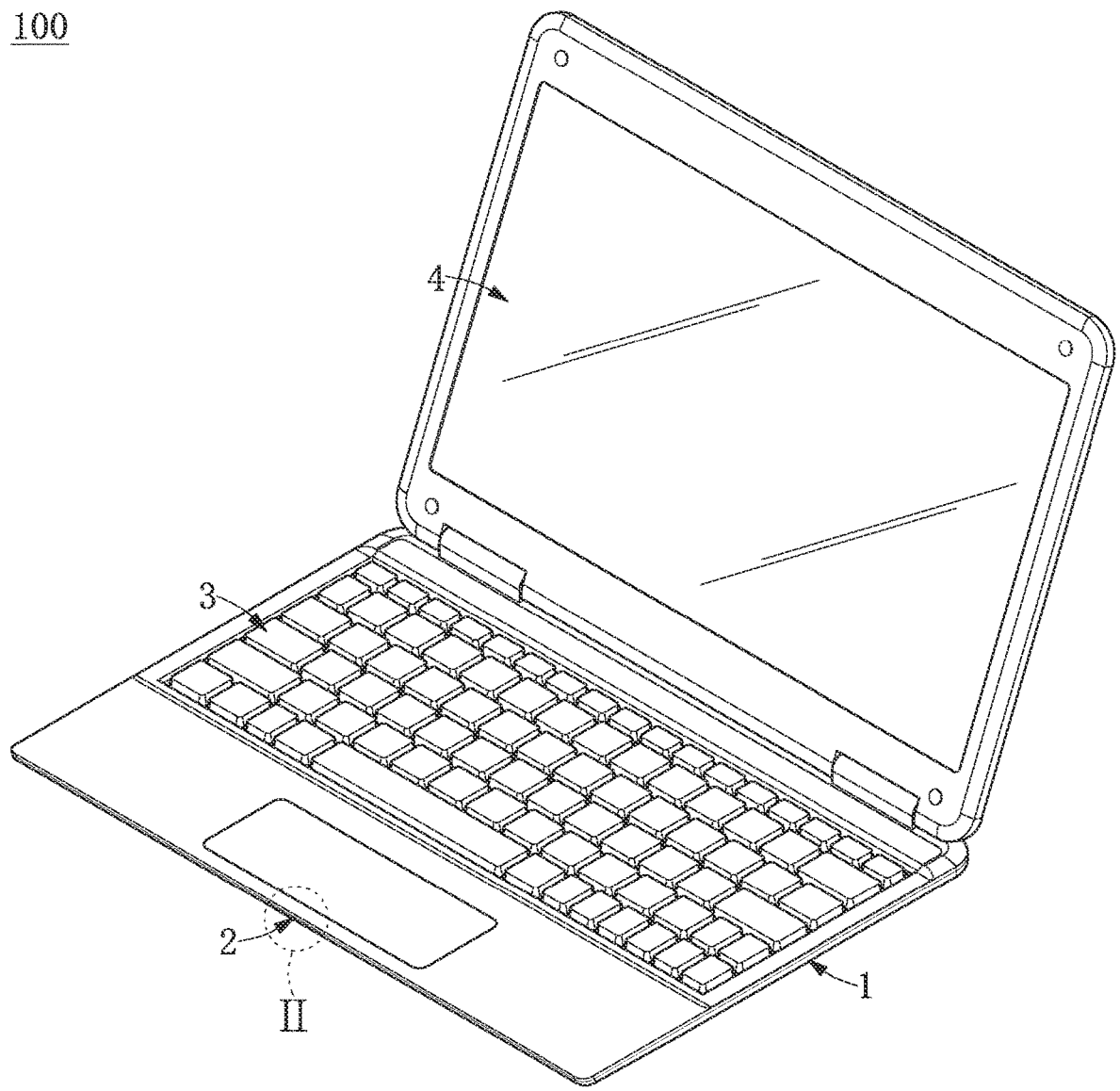
FIG. 1 is a schematic view of an electronic device of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 5, a first embodiment of the present disclosure provides an electronic device 100 that includes a housing 1, a sensing module 2, a keyboard module 3, and a display module 4. The electronic device 100 can be a laptop. The sensing module 2 of the present disclosure is disposed in the housing 1, and the keyboard module 3 is disposed in the housing 1. The display module 4 is movably connected to the housing 1. The display module 4 can include a display device and a housing. The display device can be, for example, a normal display screen or a touch screen. In different embodiments, the electronic device 100 can also be a tablet, but the present disclosure is not limited thereto. It should be noted that some related electronic components (such as a motherboard, a computer memory, and a CPU) are also disposed in the housing 1, so as to allow the electronic device 100 to work normally. However, these related electronic components can be adjusted according to practical requirements, and are not limited thereto.

Figure 2:
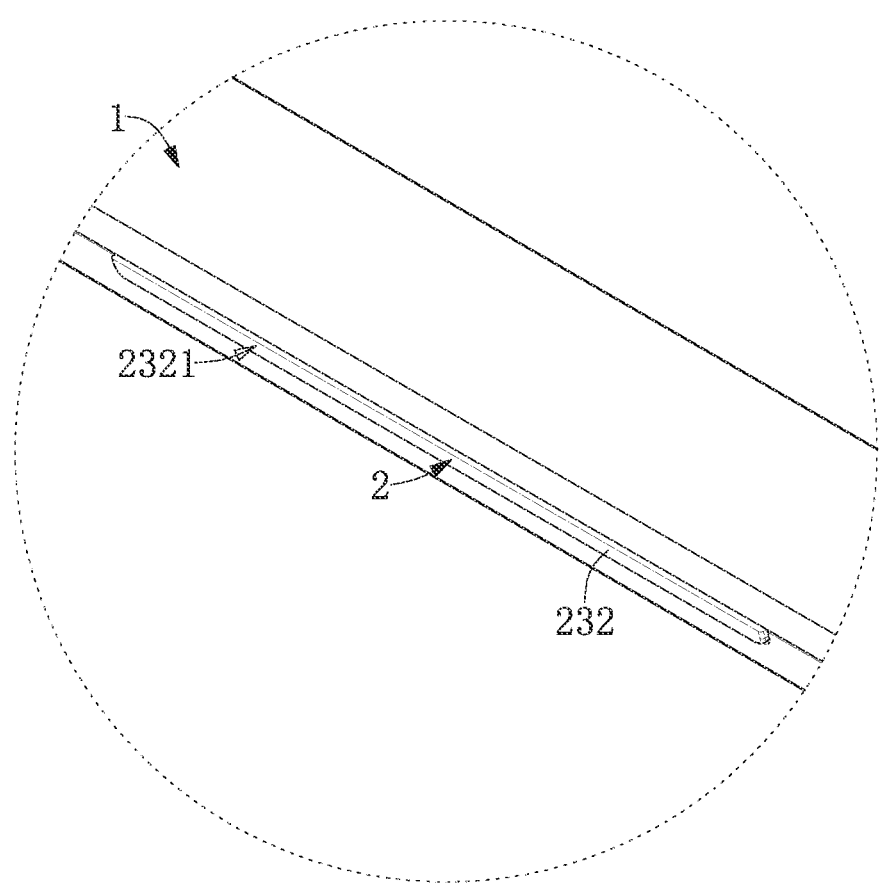
FIG. 2 is a partially enlarged view of part II of FIG. 1.
Figure 3:
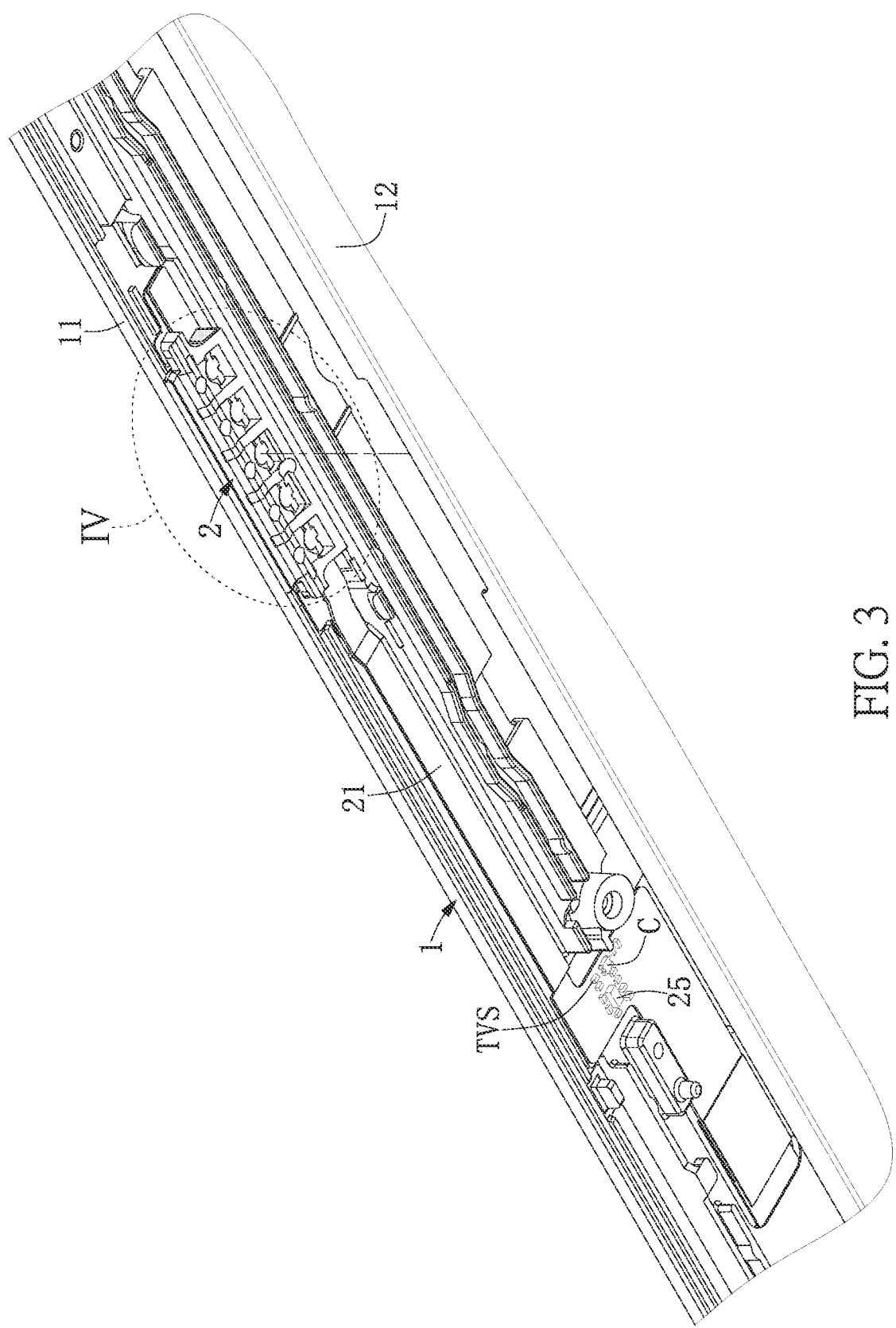
FIG. 3 is a partially exploded view of the electronic device of the present disclosure.
Figure 4:
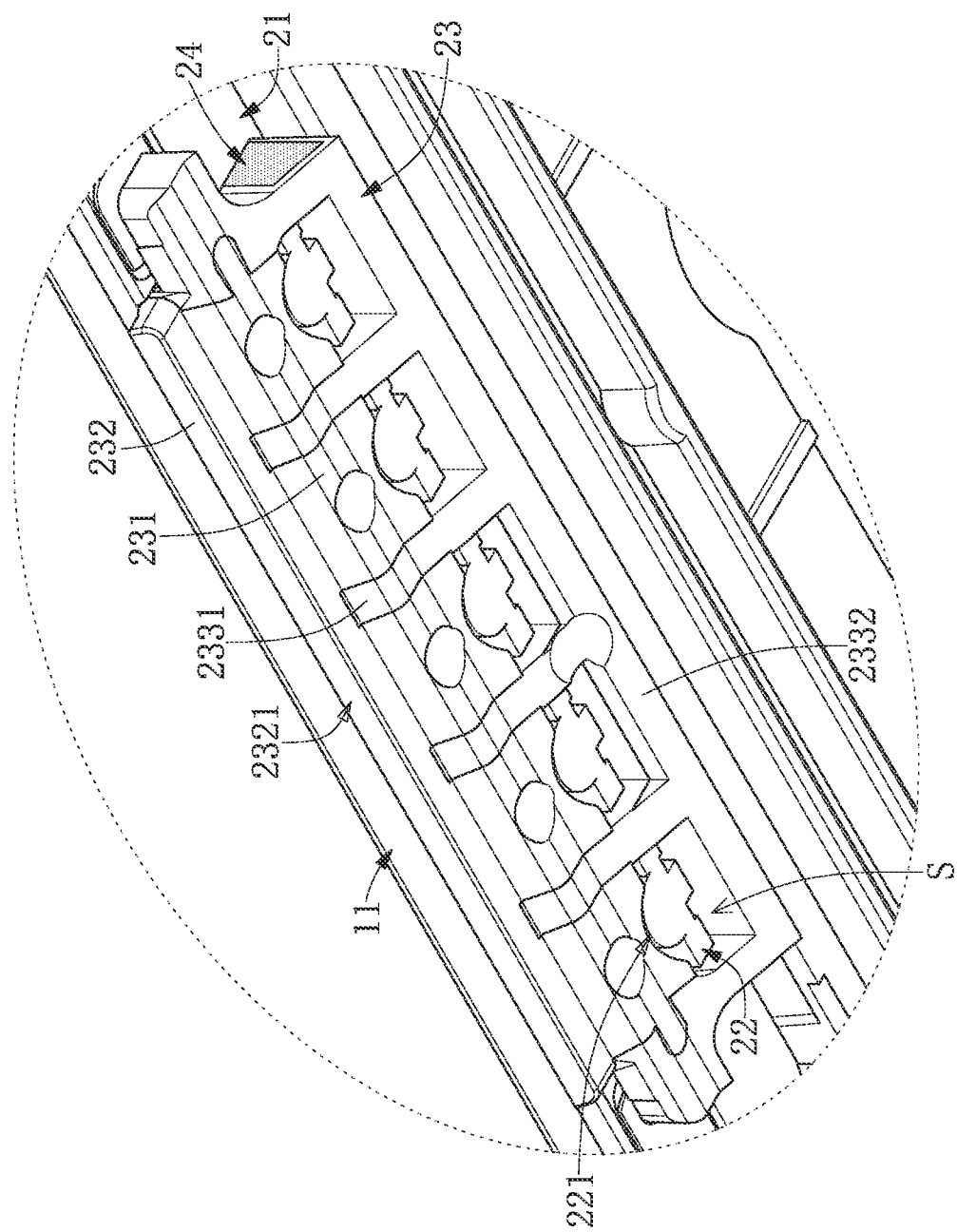
FIG. 4 is a partially enlarged view of part IV of FIG. 3.

Referring to FIG. 2 and FIG. 3, the housing 1 can include a main body 11 and a cover 12. The cover 12 is detachably fixed on the main body 11. The sensing module 2 of the present disclosure is fixed on the main body 11, and a portion of the sensing module 2 is exposed from the housing 1. The sensing module 2 is used to sense a capacitance change of the surrounding environment, and is configured to emit corresponding light beams. For example, when a user's finger is in close proximity to the surrounding environment of the sensing module 2, the sensing module 2 can sense a capacitance change of the surrounding environment. Then, it can be observed by the user that the portion of the sensing module 2 that is exposed from the housing 1 is lit up.

Referring to FIG. 4 to FIG. 9, the sensing module 2 of the present disclosure includes a substrate 21, five light-emitting units 22, a light-guiding assembly 23, two sensing circuit structures 24, and a sensing processor 25. A quantity of the light-emitting units 22 included in the sensing module 2 can be increased or decreased according to practical requirements, and is not limited to the quantity shown in the drawings. In different embodiments, the sensing module 2 can include only a single sensing circuit structure 24.

The five light-emitting units 22 are spaced apart from each other and are disposed on the substrate 21. Each of the light-emitting units 22 can be, for example, a light-emitting diode (LED) which can emit at least one color of light beams. The substrate 21 is electrically connected to the motherboard (not shown in the figures) of the electronic device 100, and a battery of the electronic device 100 can provide electricity to each of the light-emitting units 22 through the motherboard (not shown in the figures) or the substrate 21. In practice, the substrate 21 can be electrically connected to the motherboard (not shown in the figures) of the electronic device 100 through an electrical connection member (such as a flexible circuit board or a cable). However, the manner by which the substrate 21 is connected to the motherboard (not shown in the figures) is not limited. The substrate 21 can include a flexible circuit board, a rigid circuit board, or both at the same time, but the present disclosure is not limited thereto.

The light-guiding assembly 23 includes five light-guiding structures 231, a light emergent structure 232, and a baffle structure 233. The five light-guiding structures 231 are spaced apart from each other. Each of the light-guiding structures 231 has a light incident surface 2311 that is arranged to face towards a light-emitting surface 221 of one of the light-emitting units 22. The light emergent structure 232 is connected to the five light-guiding structures 231. The light emergent structure 232 has a light emergent surface 2321 that is exposed from the housing 1 (as shown in FIG. 2). In practice, the light emergent surface 2321 can be approximately flush with an outside surface of the housing 1, but the present disclosure is not limited thereto. The light emergent surface 2321 can also protrude from the outside surface of the housing 1, or the light emergent surface 2321 can also have a slightly concave shape with respect to the outside surface of the housing 1.

A light beam emitted from the light-emitting surface 221 of each of the light-emitting units 22 can enter into the light-guiding structure 231 through the light incident surface 2311 of the adjacent light-guiding structure 231, and any one of the light-guiding structures 231 is configured to guide the light beam to enter into the light emergent structure 232 in a concentrated manner, so that the light beam is emitted outwardly from the light emergent surface 2321 of the light emergent structure 232. In other words, each of the light-guiding structures 231 is mainly used to allow most of the light beams emitted from the light-emitting units 22 to be emitted outwardly from the light emergent surface 2321 of the light emergent structure 232. The specific shape of any one of the light-guiding structures 231 is not limited by the drawings. A quantity of the light-guiding structures 231 included in the light-guiding assembly 23 is not limited by the drawings, and the quantity of the light-guiding structures 231 included in the light-guiding assembly 23 corresponds to that of the light-emitting units 22. In practice, the light-guiding assembly 231 and the light emergent structure 232 can be, for example, made of a transparent material or a translucent material, but the present disclosure is not limited thereto.

The baffle wall structure 233 can include six baffle walls 2331 and a connecting wall 2332. One of the baffle walls 2331 is arranged between two adjacent ones of the light-emitting units 22, and the connecting wall 2332 is connected to the six baffle walls 2331. One of the baffle walls 2331 is arranged between two adjacent ones of the light-guiding structures 231, and each of the light-guiding structures 231, two adjacent ones of the baffle walls 2331, and a portion of the adjacent connecting wall 2332 jointly define an accommodating space S. Each of the light-emitting units 22 is correspondingly disposed in one of the accommodating spaces S.

Each of the baffle walls 2331 and the connecting wall 2332 are used to allow most of the light beams emitted from an adjacent one of the light-emitting units 22 to enter into the light-guiding structure 231 that is arranged adjacent to said light-emitting units 22. The baffle walls 2331 are configured to allow the light beam emitted from the light-emitting units 22 to enter into the light-guiding structures 231 that are arranged adjacent to the light-emitting units 22. In an exemplary embodiment, each of the baffle walls 2331 can be made of a material that can reflect the light beams emitted from the light-emitting units 22. One part of the light beams emitted from the light-emitting units 22 and not entering the adjacent light-guiding structure 231 can be reflected by the baffle walls 2331 or the connecting wall 2332 and re-enter the light-guiding structures 231. In different embodiments, each of the baffle walls 2331 can also be made of a material that can absorb the light beams emitted from the light-emitting units 22.

According to the description above, most of the light beams emitted from each of the light-emitting units 22 can be emitted outwardly from the light emergent surface 2321 of the light emergent structure 232 through the configuration of the light-guiding structures 231, the light emergent structure 232, and the baffle structure 233. Therefore, the user can clearly observe the quantity of the light-emitting units 22 of the sensing module 2 that are currently lit through the light emergent surface 2321 of the light emergent structure 232. It should be noted that a quantity of the baffle walls 2331 included in the baffle structure 233, and a position arrangement of each of the baffle walls 2331 corresponding to the light-guiding structures 231 and the light-emitting units 22 are not limited by the drawings.

Figure 6:
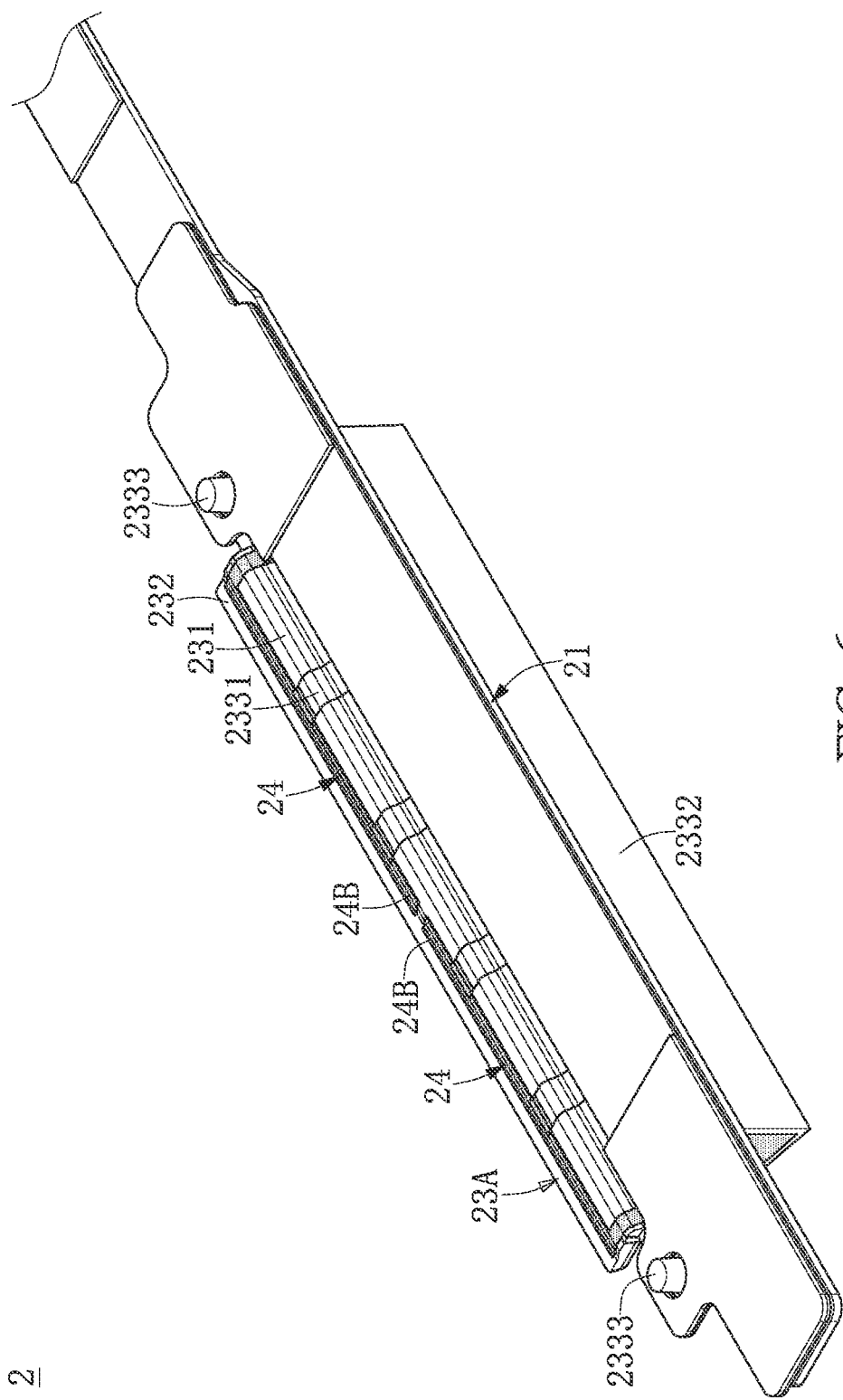
FIG. 6 is a partially enlarged view of the sensing module of the present disclosure from another angle of view.
Figure 7:
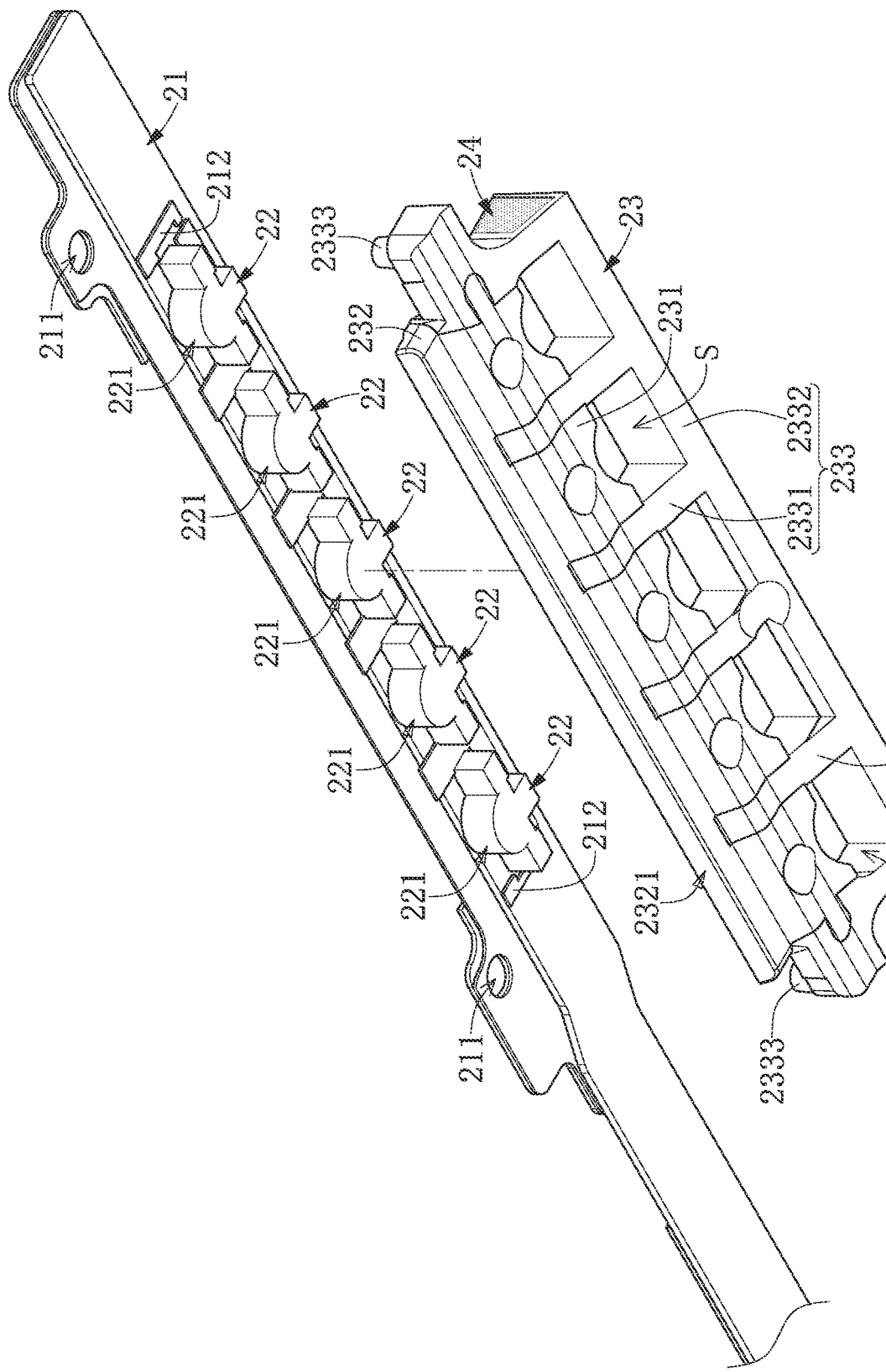
FIG. 7 is a partially exploded schematic view of the sensing module of the present disclosure.
Figure 8:
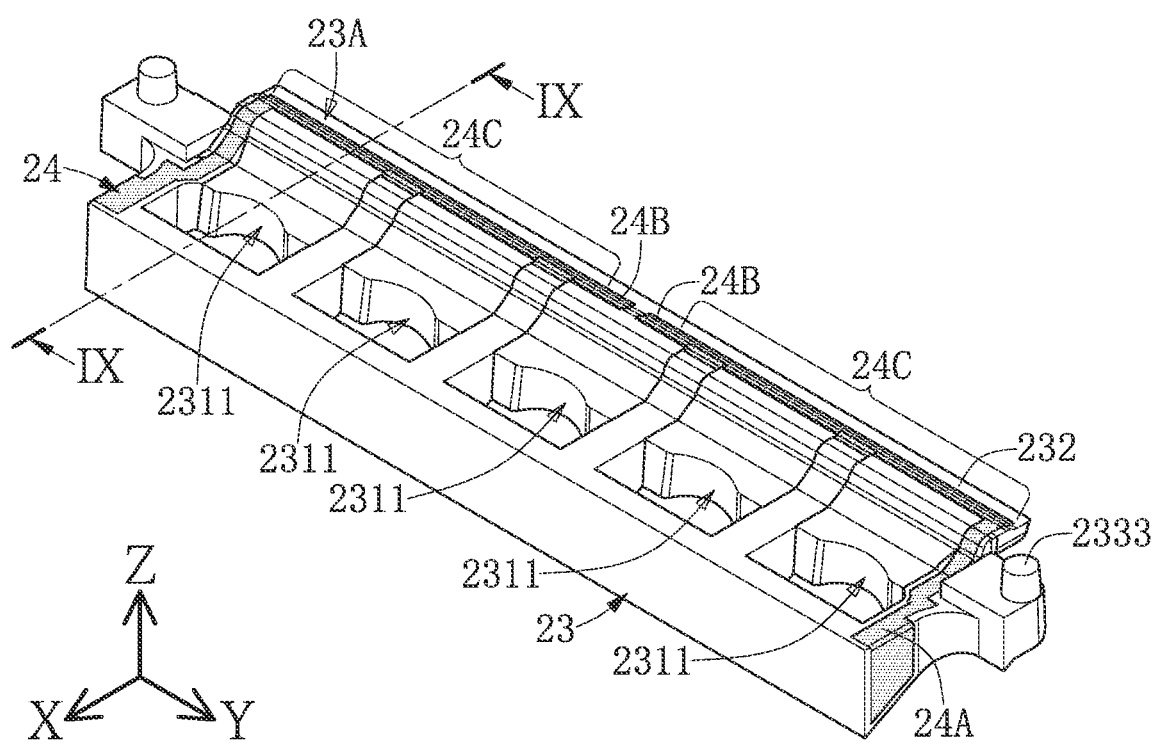
FIG. 8 is a schematic view of a light-guiding assembly of the sensing module of the present disclosure from another angle of view.

Referring to FIG. 6 to FIG. 8, in practice, the baffle structure 233 can also include two fixing parts 2333. The two fixing parts 2333 can be located at two ends of the baffle structure 233, and the light-guiding assembly 23 can be fixed on the substrate 21 through the two fixing parts 2333. For example, each of the fixing parts 2333 can be a cylindrical structure. The substrate 21 can correspondingly have two through-holes 211, and each of the fixing parts 2333 is fixed in one of the through-holes 211. The manner by which each of the fixing parts 2333 is fixed with each of the through-holes 211 can be, for example, an interference fit. A quantity of the fixing parts 2333 included in the baffle structure 233 and a quantity of the through-holes 211 included in the substrate 21 are not limited by the drawings. Furthermore, both the size and the shape of each of the fixing parts 2333 and the size and the shape of each of the through-holes 211 are not limited by the drawings. Naturally, the manner by which the light-guiding assembly 23 is fixed on the substrate 21 is not limited by the above description. In different embodiments, the light-guiding assembly 23 can also be fixed on the substrate 21 by glue. Or, the light-guiding assembly 23 can be fixed on the substrate 21 by simultaneously using glue and the fixing parts 2333.

One portion of each of the sensing circuit structures 24 is disposed on a side surface 23A of the light-guiding assembly 23. The side surface 23A is adjacent to the light emergent surface 2321. Each of the sensing circuit structures 24 has two ends that are defined as a fixing end 24A and a free end 24B, respectively. The fixing end 24A of each of the sensing circuit structures 24 is electrically connected to the substrate 21, and the free ends 24B of the two sensing circuit structures 24 are spaced apart from each other and are disposed on the side surface 23A of the light-guiding assembly 23.

Each of the sensing circuit structures 24 can also have a sensing section 24C that is located on the side surface 23A. The fixing end 24A of each of the sensing circuit structures 24 can be electrically connected to an electrical connection structure 212 of the substrate 21. For example, each of the sensing circuit structures 24 is electrically connected to the sensing processor 25 or an external controller (e.g., the CPU of the electronic device 100) through the electrical connection structure 212 by tin soldering.

In practice, the five light-guiding structures 231, the light emergent structure 232, and the baffle structure 233 included in the light-guiding assembly 23 can be integrally formed and made by using a co-injection molding technology. In addition, the two sensing circuit structures 24 are formed on the light-guiding assembly 23 by laser direct structuring (LDS).

Figure 9:
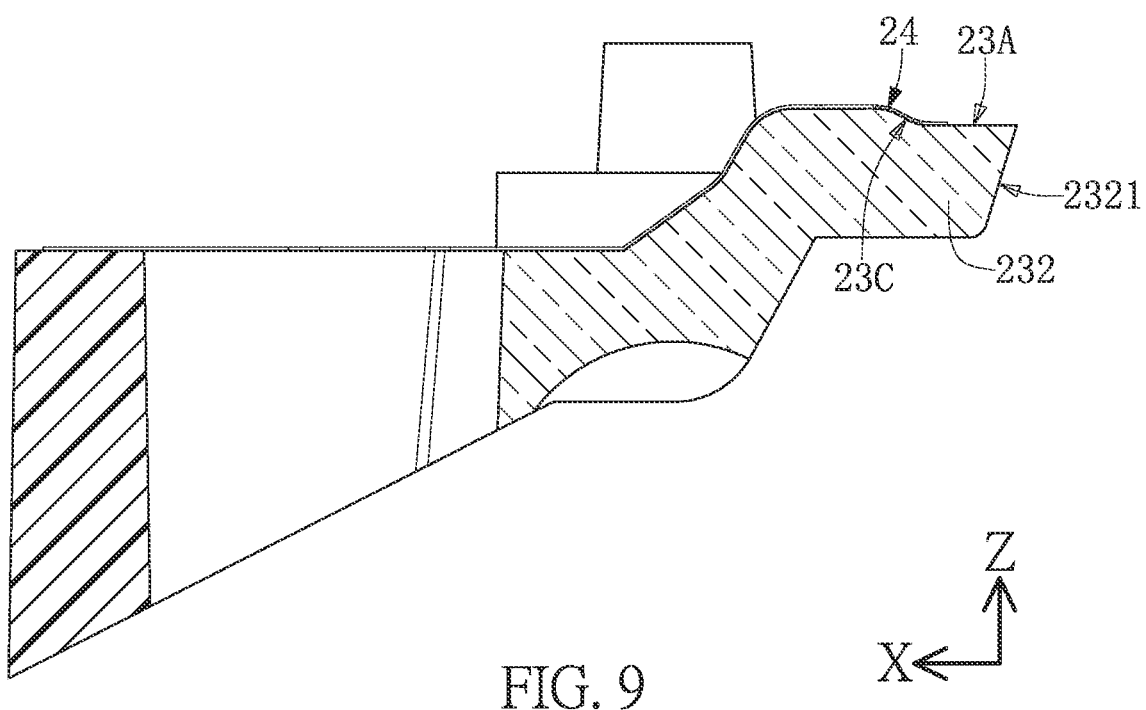
FIG. 9 is a schematic cross-sectional view taken along line IX-IX of FIG. 8.
Figure 10:
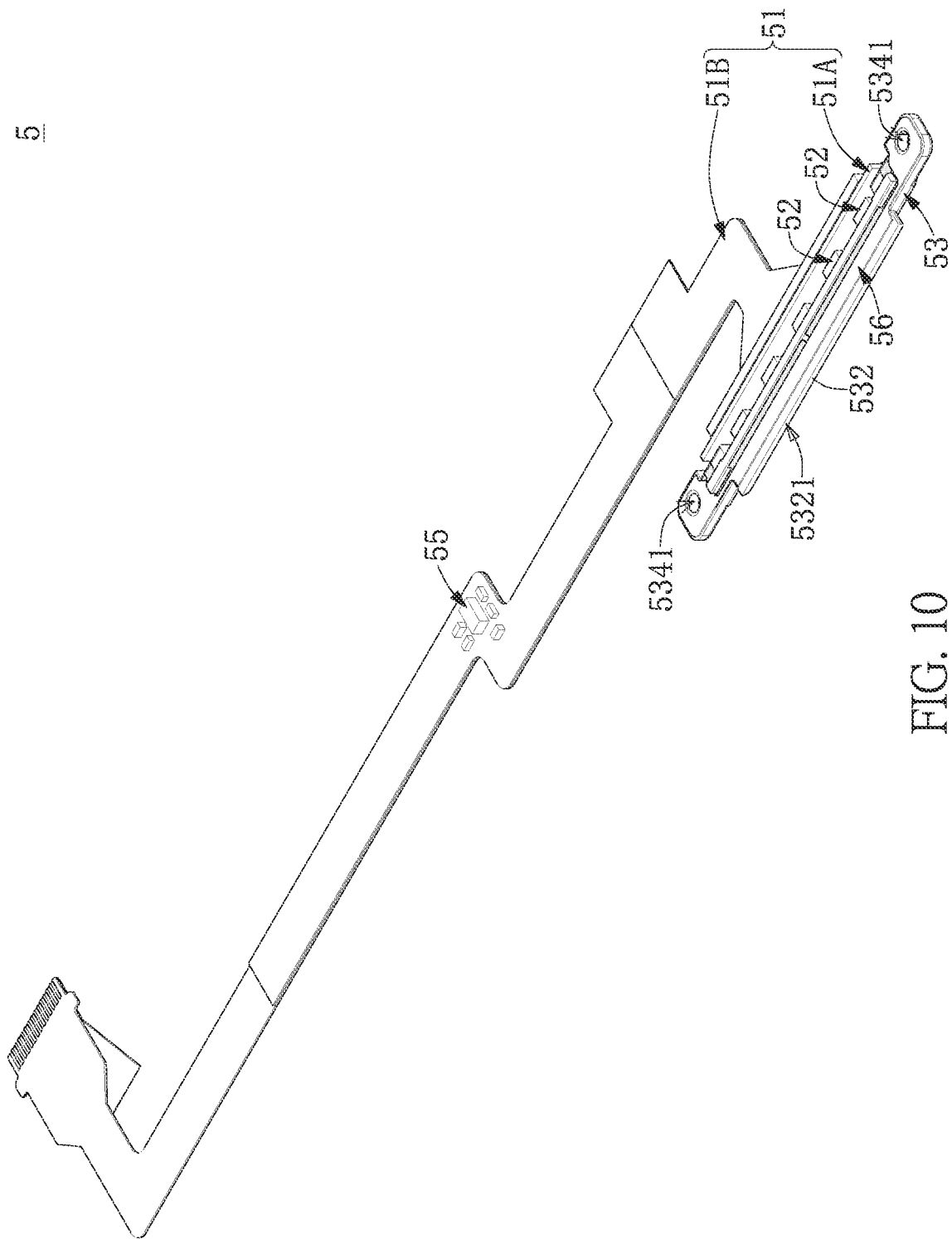
FIG. 10 is a schematic view of a sensing module according to a second embodiment of the present disclosure.

Referring to FIG. 8 to FIG. 9, in an exemplary embodiment, the light-guiding assembly 23 can also have an auxiliary side surface 23C which is adjacent to the side surface 23A. A normal vector of the auxiliary side surface 23C and a normal vector of the side surface 23A are not parallel to each other. One portion of the sensing section 24C of the sensing circuit structures 24 is disposed on the auxiliary side surface 23C. For example, if the side surface 23A of the light-guiding assembly 23 is located in the X-Y plane of a coordinate system shown in the drawings, the auxiliary side surface 23C is not located in the X-Y plane, and the auxiliary side surface 23C can face towards the light emergent surface 2321. Through the design that one portion of the sensing circuit structures 24 is disposed on the auxiliary side surface 23C, a sensing sensitivity of the sensing section 24C of each of the sensing circuit structures 24 can be improved.

The sensing processor 25 is disposed on the substrate 21. The sensing processor 25 and the two sensing circuit structures 24 can cooperate with each other, so as to sense a capacitance change in a peripheral area of each of the sensing circuit structures 24 and to generate a corresponding sensing signal. The sensing processor 25 or the external controller (e.g., the CPU of the electronic device 100) is configured to control at least one of the light-emitting units 22 according to the sensing signal, so as to allow the at least one of the light-emitting units 22 to lit up, to be extinguished, to emit specific color light beams, or to increase or decrease brightness.

In one specific embodiment, when the user's finger approaches the light emergent surface 2321 of the light emergent structure 232 of the sensing module 2, at least one of the sensing circuit structures 24 and the sensing processor 25 can cooperate with each other and sense a capacitance change in a peripheral area of the sensing circuit structures 24, so that the sensing processor 25 will correspondingly generate the sensing signal. After receiving the sensing signal, the sensing processor 25 or the CPU of the electronic device 100 (i.e., the external controller) can control at least one of the light-emitting units 22 to lit up according to the current electricity of the battery of the electronic device 100. Therefore, by observing a quantity of the light-emitting units 22 that are currently lit, the user can know the current electricity of the battery of the electronic device 100. For example, if the user observes that the five light-emitting units 22 are all lighted up, the battery of the electronic device 100 can be known to have 80% to 100% of electricity. If four of the light-emitting units 22 are lighted up, the battery of the electronic device 100 can be known to have 60% to 80% of electricity, and so on. If only one of the light-emitting units 22 is lighted up, the battery is known to have electricity lower than 20%. In one of the embodiments, when the electricity of the battery is lower than 20%, the sensing processor 25 not only controls one of the light-emitting units 22 to lit up but also controls the one of the light-emitting units 22 to emit light beams of different colors (e.g., red), so as to remind the user that the battery currently has low electricity and needs to be charged.

Naturally, after the sensing processor 25 or the external controller receives the sensing signal, the present disclosure is not limited to controlling at least one of the light-emitting units 22 of the sensing module 2 to lit up according to the current electricity of the electronic device 100. In practice, according to requirements, the sensing processor 25 or the external controller can receive the sensing signal, and then correspondingly control a different number of the light-emitting units 22 to lit up in response to different states of the electronic device 100 (e.g., the intensity of a wireless signal).

It should be noted that, in the embodiment that a quantity of the sensing circuit structure 24 is two, the sensing processor 25 can be in cooperation with each of the two sensing circuit structures 24, so as to sense whether a capacitance change in a peripheral area of each of the two sensing circuit structures 24 has occurred. For example, the sensing processor 25 can only control at least one of the light-emitting units 22 to lit up when the two sensing circuit structures 24 both sense a capacitance change in a peripheral area of the two sensing circuit structures 24. When only one of the sensing circuit structures 24 senses a capacitance change at the surrounding environment thereof, the sensing processor 25 does not control any one of the light-emitting units 22 to lit up. Therefore, an issue of misjudgment of the sensing module 2 can be effectively avoided.

In the embodiment that the quantity of the sensing circuit structure 24 is two, the sensing processor 25 can also be in cooperation with both of the two sensing circuit structures 24, so as to determine whether the user's finger is sliding from left to right or is sliding from right to left on the light emergent surface 2321 (or the space close to the light emergent surface 2321). The sensing processor 25 can control at least one of the light-emitting units 22 to lit up according to the different states of the electronic device 100. For example, when the sensing processor 25 determines that the user's finger slides from the right side of the light emergent surface 2321 to the left side of the light emergent surface 2321, the sensing processor 25 can control a corresponding number of the light-emitting units 22 to lit up according to the electricity of the battery of the electronic device 100. Conversely, when the sensing processor 25 determines that the user's finger slides from the left side of the light emergent surface 2321 (or the space close to the light emergent surface 2321) to the right side of the light emergent surface 2321, the sensing processor 25 can control the corresponding number of the light-emitting units 22 to lit up according to the intensity of the wireless signal of the electronic device 100.

In the embodiment that the quantity of the sensing circuit structure 24 is two, the sensing processor 25 can control at least one of the light-emitting units 22 to actuate according to the two sensing signals when the two sensing circuit structures 24 both sense that a capacitance change in their surrounding environment has exceeded a predetermined threshold.

Figure 5:
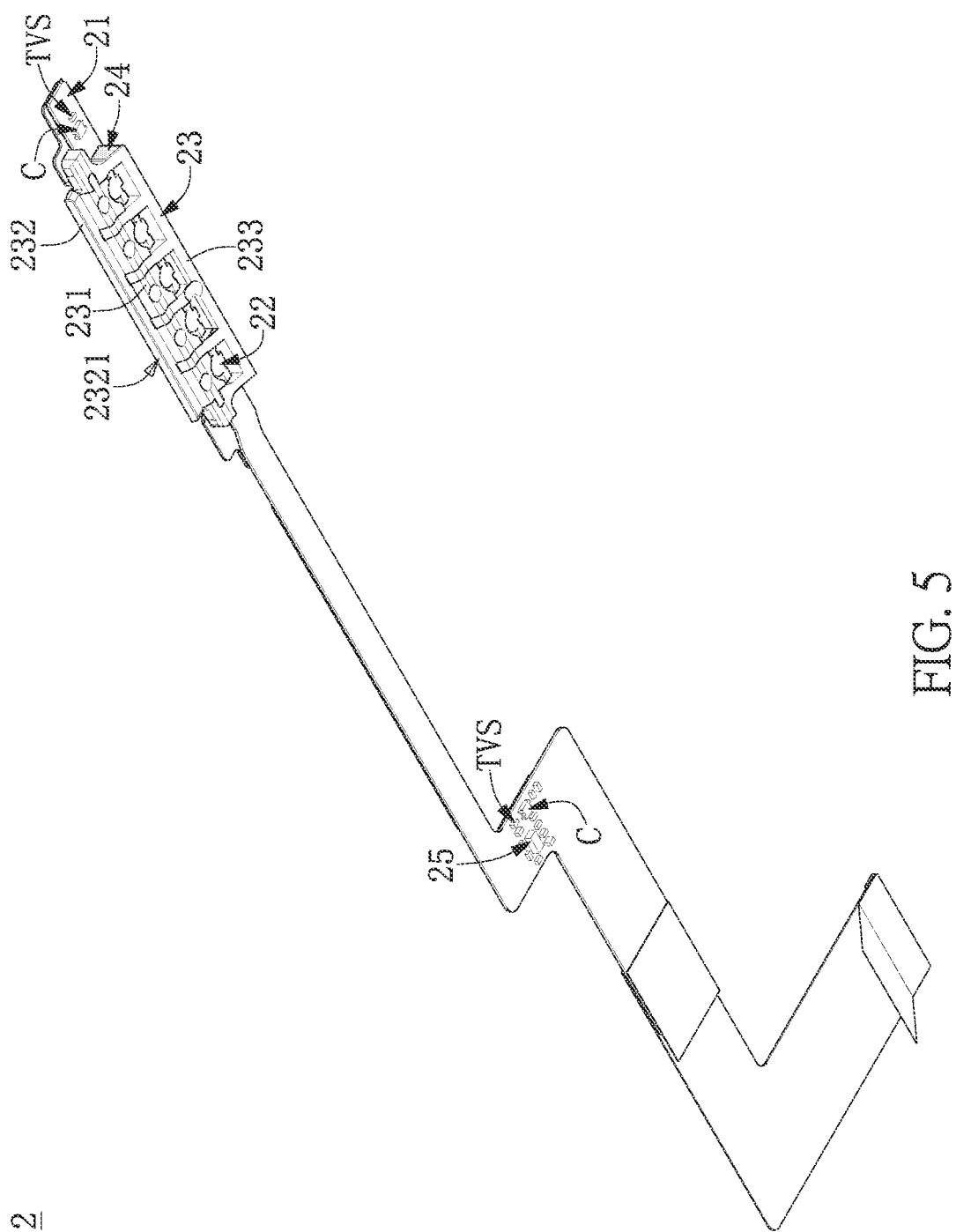
FIG. 5 is a schematic view of a sensing module of the present disclosure.

Referring to FIG. 1 and FIG. 5, in one specific embodiment, the substrate 21 can be a flexible circuit board. The five light-emitting units 22 are disposed on one end of the substrate 21, and another end of the substrate 21 can be used to electrically connect to the external controller (e.g., the CPU of the electronic device 100). The electronic device 100 can also include a transient-voltage-suppressor (TVS) and at least one capacitor C. The sensing processor 25, the transient-voltage-suppressor (TVS), and the capacitor C are all disposed on the flexible circuit board. The sensing processor 25 is electrically connected to the sensing circuit structures 24 through one path of the flexible circuit board (e.g., a conductive metal wire located in the flexible circuit board). One end of the transient-voltage-suppressor (TVS) is connected to the path, one end of the capacitor C is connected to the path, another end of the transient-voltage-suppressor (TVS) is grounded, and another end of the capacitor C is grounded. The sensing circuit structures 24 can effectively avoid being affected by static electricity through the configuration of the transient-voltage-suppressor (TVS) and the capacitor C.

In practice, a quantity of the transient-voltage-suppressor (TVS) included in the sensing module 2 and a quantity of the capacitor C included in the sensing module 2 can each correspond to a quantity of the sensing circuit structures 24, but the present disclosure is not limited thereto. A position arrangement of the transient-voltage-suppressor (TVS) and the capacitor C is also not limited by the drawings. In practice, the transient-voltage-suppressor (TVS) and the capacitor C can both be arranged adjacent to the sensing circuit structures 24, so as to improve an effect of electrostatic protection.

It should be noted that, in the drawings of the first embodiment, the sensing module 2 is exemplified by including two sensing circuit structures 24, but the quantity of the sensing circuit structures 24 included in the sensing module 2 is not limited to two. In different embodiments, the sensing module 2 can also include only one sensing circuit structure 24.

Second Embodiment

Reference is made to FIG. 10 to FIG. 16, which are different schematic views of a sensing module according to a second embodiment of the present disclosure. A sensing module 5 in the second embodiment includes a substrate 51, five light-emitting units 52, a light-guiding assembly 53, two sensing circuit structures 54, and a sensing processor 55. The light-emitting units 52 and the sensing processor 55 in the present embodiment are the same as the light-emitting units 22 and the sensing processor 25 in the first embodiment, and will not be reiterated herein.

The substrate 51 can include a rigid circuit board 51A and a flexible circuit board 51B. The light-emitting units 52 are disposed on the rigid circuit board 51A. The flexible circuit board 51B is connected to the rigid circuit board 51A. One end of the flexible circuit board 51B is opposite to another end of the flexible circuit board 51B that is connected to the rigid circuit board 51A, and the one end of the flexible circuit board 51B can be used to connect to the motherboard of the electronic device 100 (as shown in FIG. 1). Naturally, in different embodiments, the substrate 51 can include only the rigid circuit board 51A, and the substrate 51 is electrically connected to the motherboard of the electronic device 100 through a connection line or a contact, etc.

The light-guiding assembly 53 includes a light-guiding structure 531, a light emergent structure 532, two fixing structures 533 and two auxiliary fixing structures 534. In practice, the light-guiding structure 531, the light emergent structure 532, the two fixing structures 533 and the two auxiliary fixing structures 534 are integrally formed. Two ends of the light-guiding structure 531 are connected to the two fixing structures 533, respectively. The two fixing structures 533 are used to abut against one surface of the substrate 51 that has the five light-emitting units 52 disposed thereon. Each of the fixing structures 533 can, for example, include a fixing post 5331. Each of the fixing posts 5331 is used to engage and to fix to a fixing hole 511 of the substrate 51.

Figure 13:
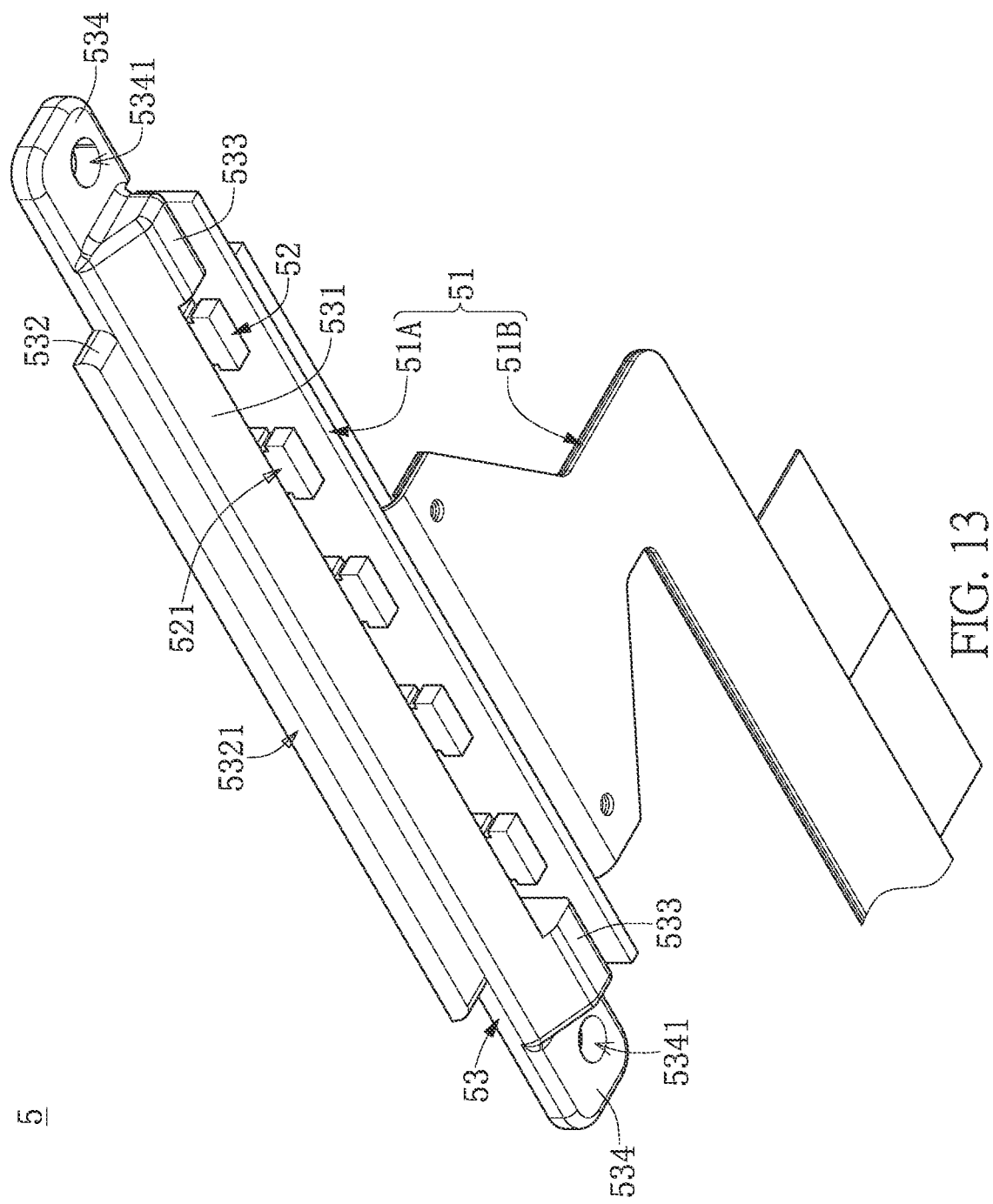
FIG. 13 is a schematic view of the sensing module according to the second embodiment of the present disclosure from another angle of view.
Figure 14:
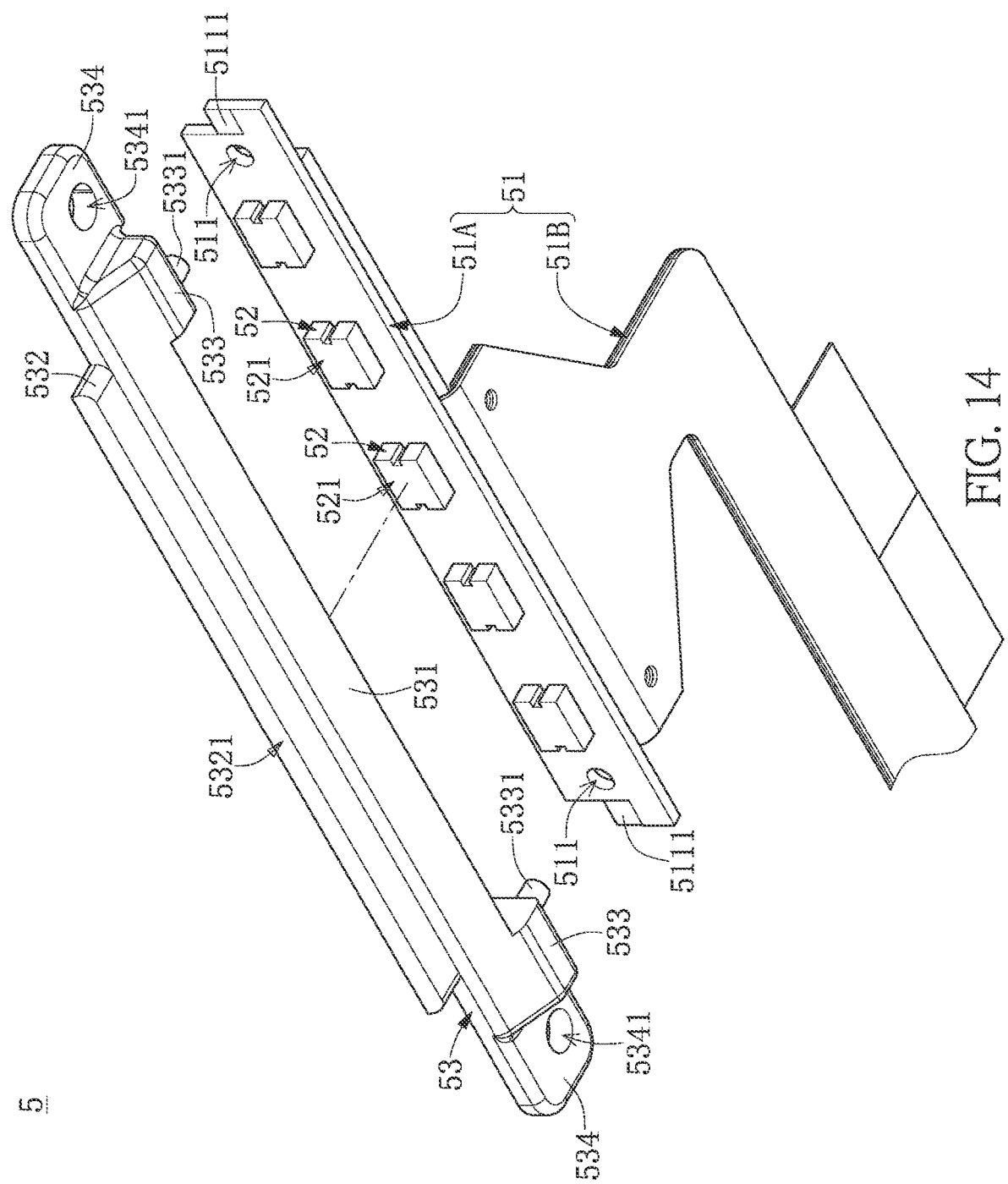
FIG. 14 is a partially exploded schematic view of the sensing module according to the second embodiment of the present disclosure.
Figure 15:
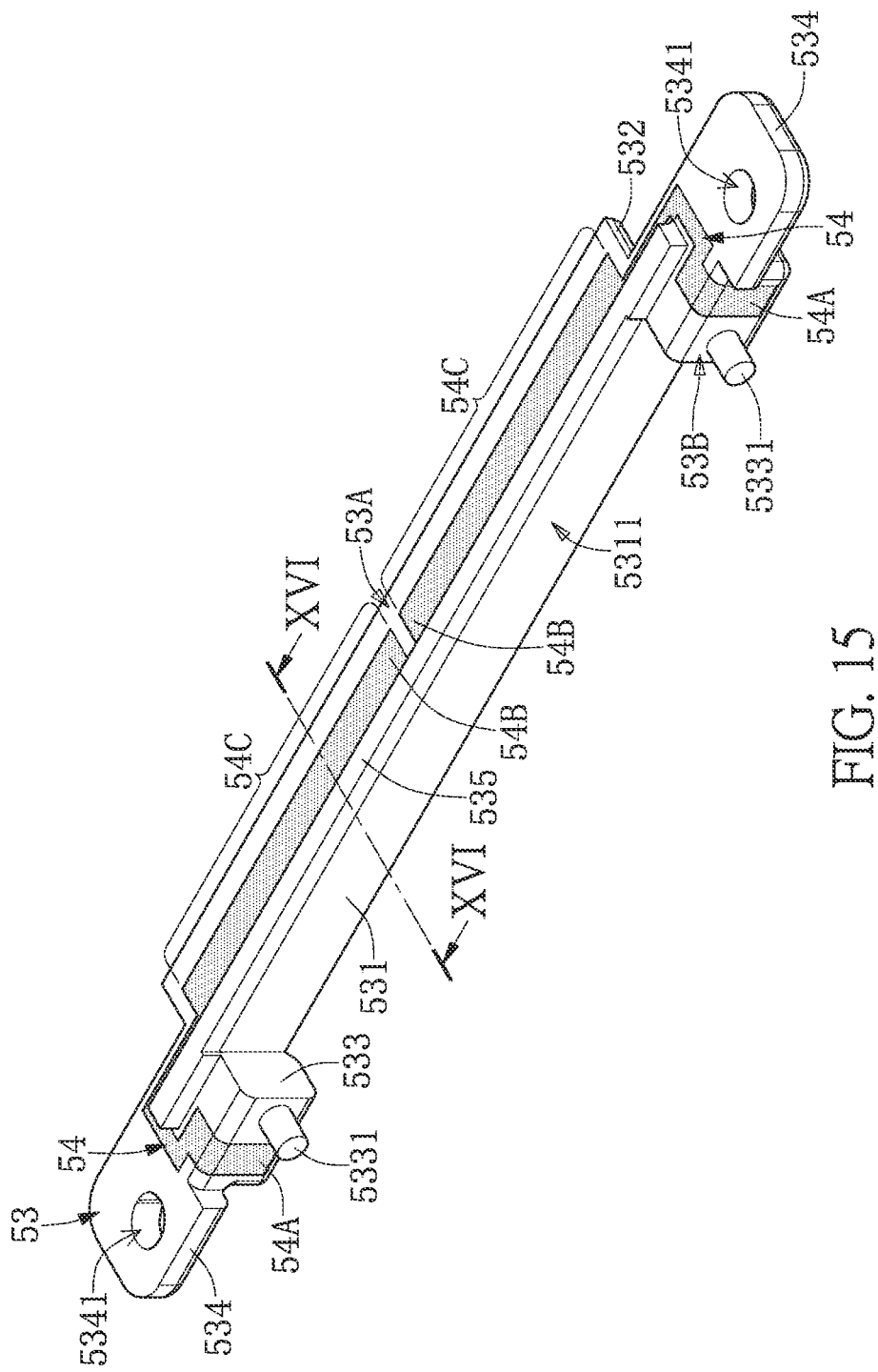
FIG. 15 is a schematic view of a light-guiding assembly of the sensing module according to the second embodiment of the present disclosure from a different angle of view.
Figure 16:
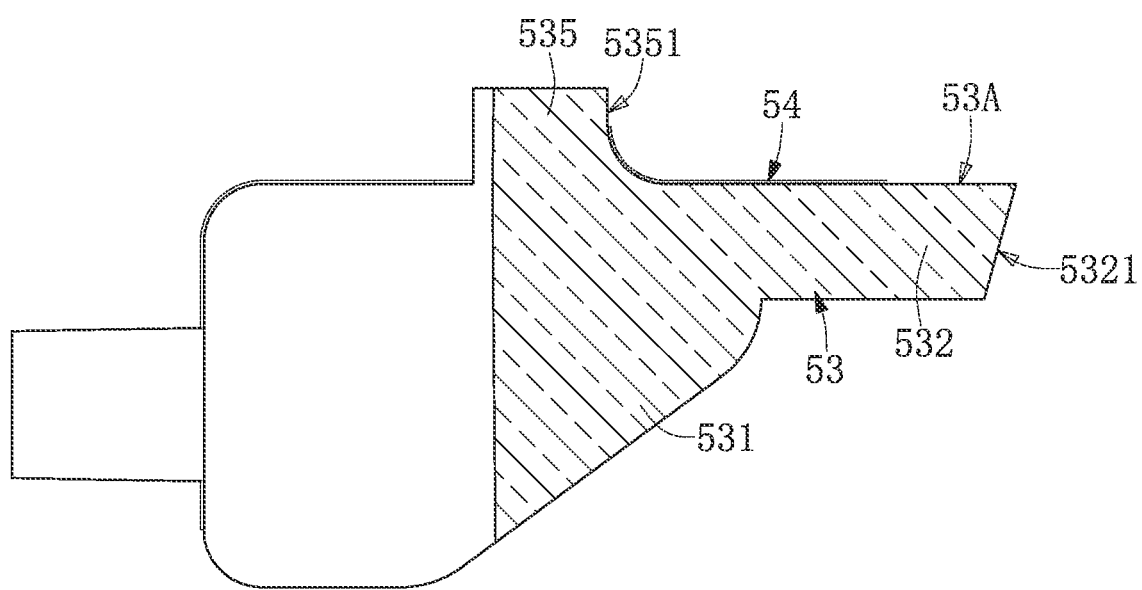
FIG. 16 is a schematic cross-sectional view taken along line XVI-XVI of FIG. 15.

Referring to FIG. 13 to FIG. 15, the light-guiding structure 531 has a light incident surface 5311 that faces towards a light-emitting surface 521 of each of the light-emitting units 52. One side of the light-guiding structure 531 that is opposite to another side of the light-guiding structure 531 having the light incident surface 5311 is connected to the light emergent structure 532. Light beams that are emitted from the light-emitting surface 521 of each of the light-emitting units 52 can enter into the light-guiding structure 531 through the corresponding light incident surface 5311, and any one of the light-guiding structures 531 is configured to guide the light beams to emit outwardly from a light emergent surface 5321 of the light emergent structure 532. In the present disclosure, the shape of the light-guiding structure 531 is not limited by the drawings. In practice, through changing the shape of the light-guiding structure 531, the light beams that enter into the light-guiding structure 531 can emit outwardly from the light emergent surface 5321 of the light emergent structure 532 in a more concentrated manner.

In the drawings of the present embodiment, a gap is present between the light incident surface 5311 of the light-guiding structure 531 and the light-emitting surface 521 of each of the light-emitting units 521, but the present disclosure is not limited thereto. In different embodiments, there is hardly any gap between the light incident surface 5311 and each of the light-emitting surfaces 521. Or, the light incident surface 5311 can abut against each of the light-emitting surfaces 521.

In the drawings of the present embodiment, the light-guiding structure 531 is exemplified as having only one flat light incident surface 5311. However, a quantity of the light incident surface 5311 included in the light-guiding structure 531 and the shape of the light incident surface 5311 included in the light-guiding structure 531 are not limited thereto. In different embodiments, the light-guiding structure 531 can also include five light incident surfaces 5311, and the five light incident surfaces 5311 are arc surfaces. Each of the light incident surface 5311 faces towards the light-emitting surface 521 of one of the light-emitting units 52.

Referring to FIG. 11 to FIG. 15, the two auxiliary fixing structures 534 can each include a through-hole 5341. Each of the through-holes 5341 is used to allow two limiting structures (not shown in the figures, such as a cylindrical structure) of the housing 1 (as shown in FIG. 1) to pass through. The two auxiliary fixing structures 534 and the two limiting structures can together limit a movable range of the light-guiding assembly 53 relative to the housing 1 (as shown in FIG. 1). Each of the sensing circuit structures 54 has two ends that are defined as a fixing end 54A and a free end 54B, respectively. One portion of each of the sensing circuit structures 54 is disposed on a side surface 53A of the light-guiding assembly 53. The side surface 53A is arranged adjacent to the light emergent surface 5321, and a sensing section 54C of each of the sensing circuit structures 54 is located in the side surface 53A. The free ends 54B of the two sensing circuit structures 54 are spaced apart from each other and are disposed on the side surface 53A. The fixing end 54A of each of the sensing circuit structures 54 can be disposed on another side surface 53B of the light-guiding assembly 53. The side surface 53B is adjacent to the side surface 53A. The fixing end 54A of each of the sensing circuit structures 54 can be electrically connected to an electrical connection structure 5111 of the substrate 51 when the light-guiding assembly 53 is fixed on the substrate 51.

In an exemplary embodiment, the light-guiding assembly 53 can also include a protruding structure 535. The protruding structure 535 and the light-guiding structure 531 are integrally formed. The protruding structure 535 can be disposed on the side surface 53A, and the protruding structure 535 can have an auxiliary side surface 5351 that is arranged adjacent to the side surface 53A. A normal vector of the auxiliary side surface 5351 and a normal vector of the side surface 53A are not parallel to each other. One portion of the sensing section 54C of each of the sensing circuit structures 54 is disposed on the auxiliary side surface 5351, and the auxiliary side surface 5351 faces approximately towards the light emergent surface 5321. As described in the first embodiment, a sensing sensitivity of each of the sensing circuit structures 54 can be improved through the one portion of the sensing section 54C of each of the sensing circuit structures 54 being disposed on the auxiliary side surface 5351.

Figure 11:
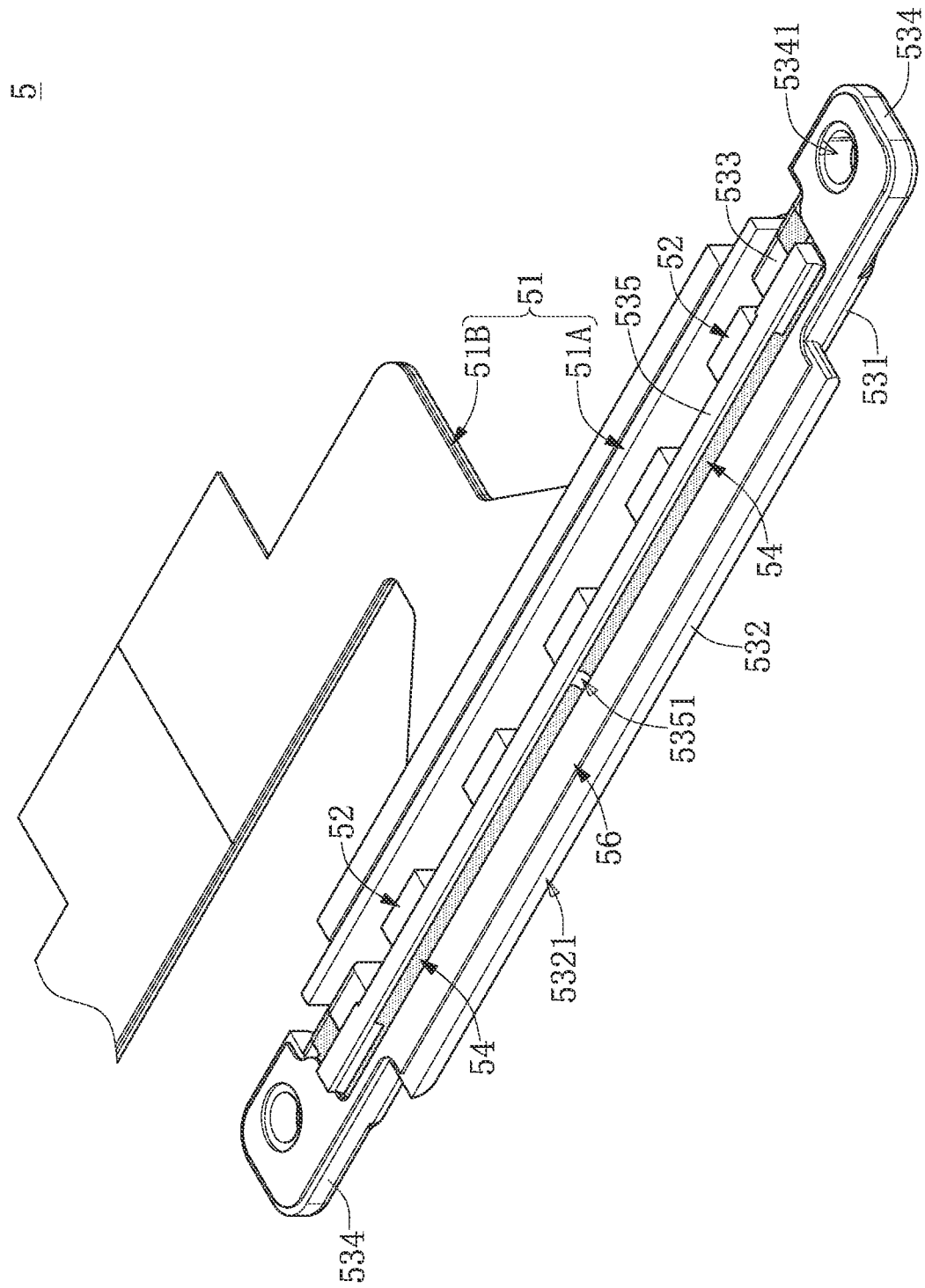
FIG. 11 is a partially enlarged view of FIG. 10.
Figure 12:
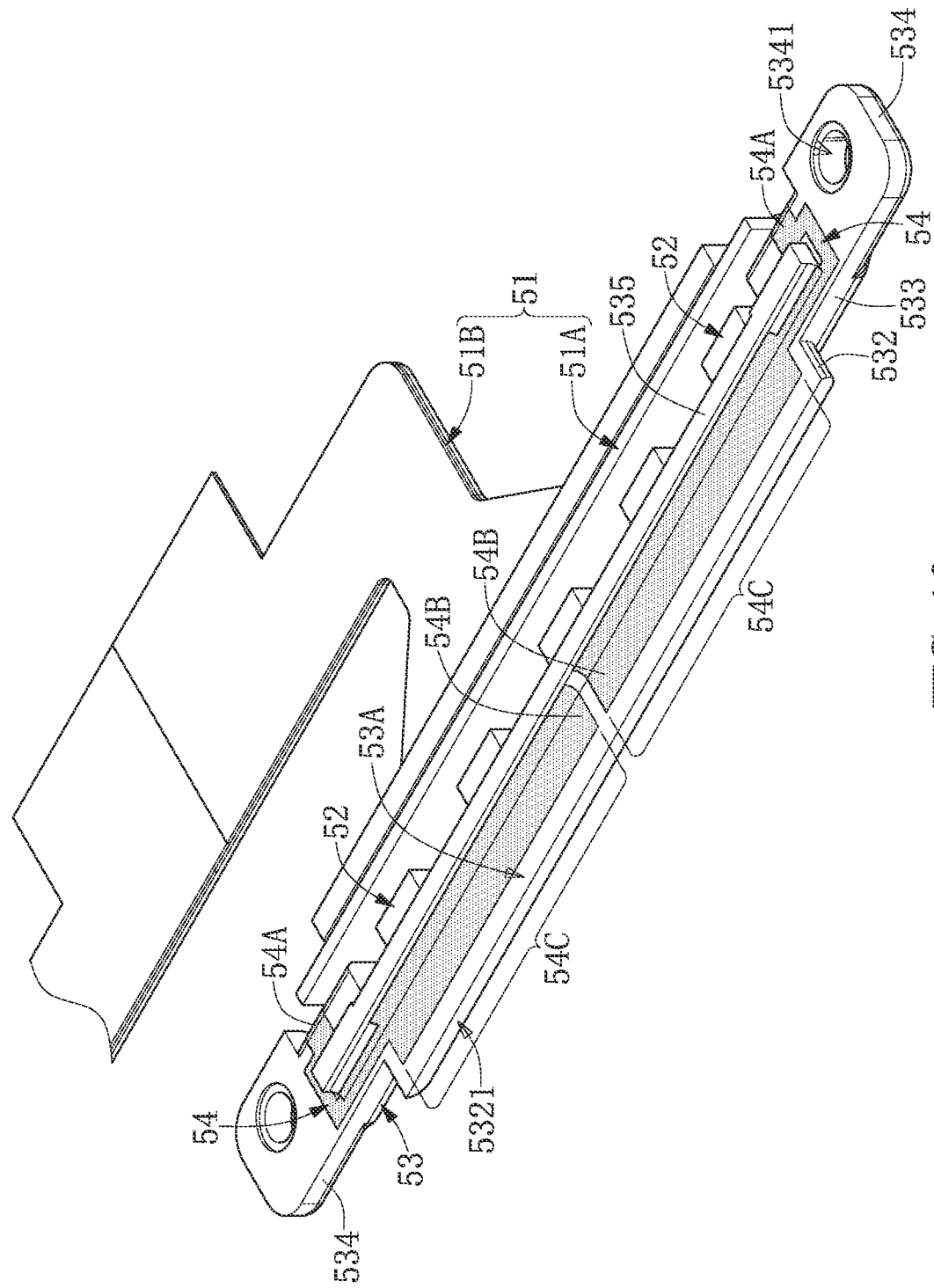
FIG. 12 is a schematic view of the sensing module that is without an insulation shielding member according to the second embodiment of the present disclosure.

Referring to FIG. 11 and FIG. 12, in practice, the sensing module 5 can also include an insulation shielding member 56, which is disposed on the side surface 53A of the light-guiding assembly 53. The insulation shielding member 56 is used to shield at least one portion of the sensing section 54C of each of the sensing circuit structures 54, so as to prevent each of the sensing sections 54C from direct exposure. Naturally, the function of the sensing processor 55 and each of the sensing circuit structures 54 cooperating with each other to sense a capacitance change of each of the sensing circuit structures 54 will not be affected by the insulation shielding member 56. The insulation shielding member 56 is merely used to protect each of the sensing sections 54C. In one specific embodiment, the insulation shielding member 56 can also be a glue, and the insulation shielding member 56 can be used for assisting the light-guiding assembly 53 to be fixed on the substrate 51.

It should be noted that, in the drawings of the second embodiment, the sensing module 5 is exemplified by including two sensing circuit structures 54. However, a quantity of the sensing circuit structures 54 included in the sensing module 5 is not limited to two. In different embodiments, the sensing module 5 may also include only one single sensing circuit structure 54.

Beneficial Effects of the Embodiments

In conclusion, in the electronic device and the sensing module provided by the present disclosure, the sensing section of each of the sensing circuit structures is configured to be disposed on the side surface of the light-guiding structure, and the side surface is arranged adjacent to the light-emitting surface of the light-emitting structure. Therefore, the sensing circuit structures are closer to a position that is touched or approached by the user (i.e., the light-emitting surface), and the sensing circuit structures can better sense the capacitance change in a peripheral area of the sensing circuit structures. In addition, in the electronic device and the sensing module provided by the present disclosure, an issue of misjudgment of the sensing circuit structures can be greatly reduced by not providing any other electronic members or conductors between each of the sensing circuit structures and the light-emitting surface.

It should be noted that the above-mentioned sensing module of the present disclosure can also be independently manufactured, implemented, and sold. The sensing module is not limited to being manufactured, implemented, and sold together with the above-mentioned electronic device only.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensing module, comprising:
   a substrate;
   at least one light-emitting unit;
   a light-guiding assembly connected to the substrate and including at least one light-guiding structure, wherein the at least one light-emitting unit is configured to emit a light beam outwardly through the at least one light-guiding structure;
   at least one sensing circuit structure, wherein one end of the at least one sensing circuit structure is disposed on the substrate, and one portion of the at least one sensing circuit structure is disposed on one side surface of the light-guiding assembly; and
   a sensing processor disposed on the substrate, wherein the sensing processor is configured to sense a capacitance change in a peripheral area of the at least one sensing circuit structure by the at least one sensing circuit structure and is configured to generate a sensing signal, and wherein the sensing processor or an external controller is configured to control the at least one light-emitting unit according to the sensing signal.

2. The sensing module according to claim 1, wherein a quantity of the sensing circuit structure is two, each of the two sensing circuit structures has two ends that are respectively defined as a fixing end and a free end, the fixing end of each of the two sensing circuit structures is electrically connected to the substrate, and the free ends of the two sensing circuit structures are spaced apart from each other and are disposed on the side surface of the light-guiding assembly.

3. The sensing module according to claim 1, wherein the sensing module includes a plurality of the light-emitting units, and the light-emitting units are spaced apart from each other and are disposed on the substrate, wherein the light-guiding assembly further includes at least one fixing structure and a light emergent structure, wherein the at least one fixing structure, the at least one light-guiding structure, and the light emergent structure are integrally formed, the at least one fixing structure is configured to fix the light-guiding assembly on the substrate, the at least one light-guiding structure has a light incident surface, each of the light-emitting units has a light-emitting surface that faces towards the light incident surface, the light emergent structure is connected to the at least one light-guiding structure, and the light emergent structure has a light emergent surface, wherein the light beam emitted from the light-emitting surface of each of the light-emitting units is configured to enter the at least one light-guiding structure through the light incident surface and be emitted outwardly from the light emergent surface, and wherein the at least one sensing circuit structure has at least one sensing section that is located on the side surface, and the side surface is arranged adjacent to the light emergent surface.

4. The sensing module according to claim 3, wherein the light-guiding assembly further includes a protruding structure, the protruding structure and the at least one light-guiding structure are integrally formed, the protruding structure is disposed on the side surface, the protruding structure has an auxiliary side surface that is arranged adjacent to the side surface, a normal vector of the auxiliary side surface and a normal vector of the side surface are not parallel to each other, and one portion of the at least one sensing section is disposed on the side surface and the auxiliary side surface.

5. The sensing module according to claim 1, wherein the light-guiding assembly includes a plurality of the light-guiding structures and a light emergent structure, the light-guiding structures are spaced apart from each other, each of the light-guiding structures has a light incident surface that faces towards a light-emitting surface of the at least one light-emitting unit, and the light emergent structure is connected to the light-guiding structures, wherein the light beam emitted from the light-emitting surface of each of multiple ones of the light-emitting unit is configured to enter the light-guiding structures through the light incident surface that is adjacent to the light-emitting surface, and wherein the at least one sensing circuit structure has at least one sensing section that is located on the side surface, and the side surface is arranged adjacent to the light emergent surface.

6. The sensing module according to claim 5, wherein the light-guiding assembly further includes a baffle structure that has a plurality of baffle walls and a connecting wall, and the baffle walls are connected to the connecting wall, wherein one of the baffle walls is arranged between two adjacent ones of the light-emitting units, one of the baffle walls is arranged between two adjacent ones of the light-guiding structures, and the baffle walls are configured to allow the light beam emitted from the light-emitting units to enter into the light-guiding structures that are arranged adjacent to the light-emitting units.

7. The sensing module according to claim 5, wherein the light-guiding assembly has an auxiliary side surface that is arranged adjacent to the side surface, a normal vector of the auxiliary side surface and a normal vector of the side surface are not parallel to each other, and one portion of the at least one sensing section of the at least one sensing circuit structure is disposed on the auxiliary side surface.

8. The sensing module according to claim 1, wherein a quantity of the sensing circuit structure is two, and the sensing processor is configured to sense the capacitance change in a peripheral area of the two sensing circuit structures by the two sensing circuit structures and is configured to generate two of the sensing signal; wherein, when the two sensing signals are greater than a threshold value, the sensing processor or the external controller is configured to control the at least one light-emitting unit according to the two sensing signals.

9. An electronic device, comprising:
a housing; and
the sensing module as claimed in claim 1, wherein a portion of the light-guiding assembly is exposed from the housing, and the light beam emitted from the at least one light-emitting unit is configured to pass through the light-guiding assembly and be emitted outwardly from the portion of the light-guiding assembly that is exposed from the housing.

10. The electronic device according to claim 9, wherein a quantity of the sensing circuit structure is two, each of the two sensing circuit structures has two ends that are respectively defined as a fixing end and a free end, the fixing end of each of the two sensing circuit structures is electrically connected to the substrate, and the free ends of the two sensing circuit structures are spaced apart from each other and are disposed on the side surface of the light-guiding assembly.

11. The electronic device according to claim 9, further comprising the external controller, a transient-voltage-suppressor, and a capacitor, wherein the substrate include a flexible circuit board that is electrically connected to the external controller, wherein the sensing processor, the transient-voltage-suppressor and the capacitor are disposed on the flexible circuit board, the sensing processor is electrically connected to the at least one sensing circuit structure through a path of the flexible circuit board, one end of the transient-voltage-suppressor is connected to the path, one end of the capacitor is connected to the path, another end of the transient-voltage-suppressor is grounded, and another end of the capacitor is grounded.

\* \* \* \* \*